United States Patent
Sung et al.

(10) Patent No.: US 9,792,869 B1
(45) Date of Patent: Oct. 17, 2017

(54) DISPLAY PANEL

(71) Applicants: Chunghwa Picture Tubes, LTD., Taoyuan (TW); National Chiao Tung University, Hsinchu (TW)

(72) Inventors: Wei-Lien Sung, Taitung County (TW); Han-Lung Liu, Taichung (TW); Wen-Chuan Wang, New Taipei (TW); Shao-Lun Chang, New Taipei (TW); Shih-Chieh Lin, Taipei (TW); Po-Tsun Liu, Hsinchu (TW); Guang-Ting Zheng, Hsinchu (TW); Shao-Huan Hung, Hsinchu County (TW)

(73) Assignees: Chunghwa Picture Tubes, LTD., Taoyuan (TW); National Chiao Tung University, Hsinchu (TW)

( * ) Notice: Subject to any disclaimer, the term of this patent is extended or adjusted under 35 U.S.C. 154(b) by 0 days.

(21) Appl. No.: 15/149,202

(22) Filed: May 9, 2016

(30) Foreign Application Priority Data

Apr. 26, 2016 (CN) .......................... 2016 1 0266440

(51) Int. Cl.
*G09G 5/00* (2006.01)
*G09G 3/36* (2006.01)

(52) U.S. Cl.
CPC ... *G09G 3/3648* (2013.01); *G09G 2310/0286* (2013.01); *G09G 2310/0289* (2013.01); *G09G 2310/061* (2013.01); *G09G 2310/08* (2013.01)

(58) Field of Classification Search
CPC ......... G09G 3/3648; G09G 2310/0286; G09G 2310/0289; G09G 2310/061
USPC .......................................................... 345/214
See application file for complete search history.

(56) References Cited

U.S. PATENT DOCUMENTS

| | | | |
|---|---|---|---|
| 7,697,655 B2 | 4/2010 | Chan et al. | |
| 8,018,423 B2 | 9/2011 | Tsai et al. | |
| 8,384,461 B2 | 2/2013 | Yonemaru et al. | |
| 2006/0274021 A1* | 12/2006 | Park ........................ | G09G 3/20 345/100 |
| 2007/0086558 A1 | 4/2007 | Wei et al. | |

(Continued)

FOREIGN PATENT DOCUMENTS

| | | |
|---|---|---|
| TW | 200519827 | 6/2005 |
| TW | 200939191 | 9/2009 |

(Continued)

*Primary Examiner* — Jonathan Blancha
(74) *Attorney, Agent, or Firm* — Jianq Chyun IP Office

(57) ABSTRACT

A display panel includes a substrate, and a pixel array and a gate driving circuit. The gate driving circuit provides gate driving signals to the pixel array, and includes shift registers, wherein each shift register includes a voltage providing unit, a first driving transistor, a voltage transmitting unit and a second driving transistor. The voltage providing unit receives a setting signal and a system high voltage to provide a first terminal voltage. The first driving transistor receives a first clock signal and the first terminal voltage to provide a first gate driving signal. The voltage transmitting unit receives the first gate driving signal to provide a second terminal voltage. The second driving transistor receives a second clock signal and the second terminal voltage to provide a second gate driving signal. Therefore, the influence caused by large difference of driving capabilities of the first and the second driving transistor is avoided.

10 Claims, 3 Drawing Sheets

(56) References Cited

U.S. PATENT DOCUMENTS

| | | | | |
|---|---|---|---|---|
| 2008/0266275 | A1* | 10/2008 | Tsai | G09G 3/3677 |
| | | | | 345/204 |
| 2010/0085294 | A1* | 4/2010 | Otose | G09G 3/3677 |
| | | | | 345/100 |
| 2013/0135284 | A1* | 5/2013 | Tseng | G11C 19/28 |
| | | | | 345/212 |

FOREIGN PATENT DOCUMENTS

| | | |
|---|---|---|
| TW | M404379 | 5/2011 |
| TW | 201220155 | 5/2012 |
| TW | I436332 | 5/2014 |
| TW | I491175 | 7/2015 |

* cited by examiner

DISPLAY PANEL

CROSS-REFERENCE TO RELATED APPLICATION

This application claims the priority benefit of China application serial no. 201610266440.0, filed on Apr. 26, 2016. The entirety of the above-mentioned patent application is hereby incorporated by reference herein and made a part of this specification.

BACKGROUND OF THE INVENTION

Field of the Invention

The invention relates to a display panel.

Description of Related Art

In recent years, along with quick development of semiconductor technology, portable electronic products and flat panel display products are widely used. In various flat panel displays, since liquid crystal display (LCD) has advantages of low voltage operation, no radiation scattering, light weight and small volume, etc., it has become a mainstream in the display products. In order to decrease the manufacturing cost of the LCD, some manufacturers have provided a technique of directly fabricating thin film transistors (TFT) on a glass substrate to form multistage shift registers, so as to replace an existing commonly used gate driving chip to decrease the manufacturing cost of the LCD. Moreover, in order to decrease the cost of the display panel and narrow a frame of the display panel, the number of the transistors used in the shift register is gradually decreased. Therefore, how to ensure a normal operation of the shift register in case that the number of the transistors is decreased has become an important issue in design of the display panel.

SUMMARY OF THE INVENTION

The invention provides a display panel including a substrate, a pixel array, and a gate driving circuit. The pixel array is disposed on the substrate. The gate driving circuit is disposed on the substrate, and is coupled to the pixel array for providing a plurality of gate driving signals to the pixel array. The gate driving circuit has a plurality of shift registers, and each of the shift registers includes a voltage providing unit, a first driving transistor, a first capacitor, a voltage transmitting unit, a second driving transistor, a second capacitor and a voltage pull-down unit. The voltage providing unit receives a setting signal and a system high voltage to provide a first terminal voltage. A first terminal of the first driving transistor receives a first clock signal, a second terminal of the first driving transistor provides a first gate driving signal in the gate driving signals, and a control terminal of the first driving transistor receives the first terminal voltage. The first capacitor is coupled between the control terminal and the second terminal of the first driving transistor. The voltage transmitting unit receives the first gate driving signal to provide a second terminal voltage. A first terminal of the second driving transistor receives a second clock signal, a second terminal of the second driving transistor provides a second gate driving signal in the gate driving signals, and a control terminal of the second driving transistor receives the second terminal voltage. The second capacitor is coupled between the control terminal and the second terminal of the second driving transistor. The voltage pull-down unit receives the first terminal voltage, the first gate driving signal, the second terminal voltage, the second gate driving voltage, the first clock signal, the second clock signal, a reset signal and a system low voltage, and pulls down the first terminal voltage, the first gate driving signal, the second terminal voltage and the second gate driving voltage.

According to the above descriptions, in the display panel of the invention, each of the shift registers in the gate driving circuit sequentially provides two gate driving signals, and the first driving transistor and the second driving transistor are sequentially turned on, so as to avoid the influence caused by excessively large difference between driving capabilities of the first driving transistor and the second driving transistor.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
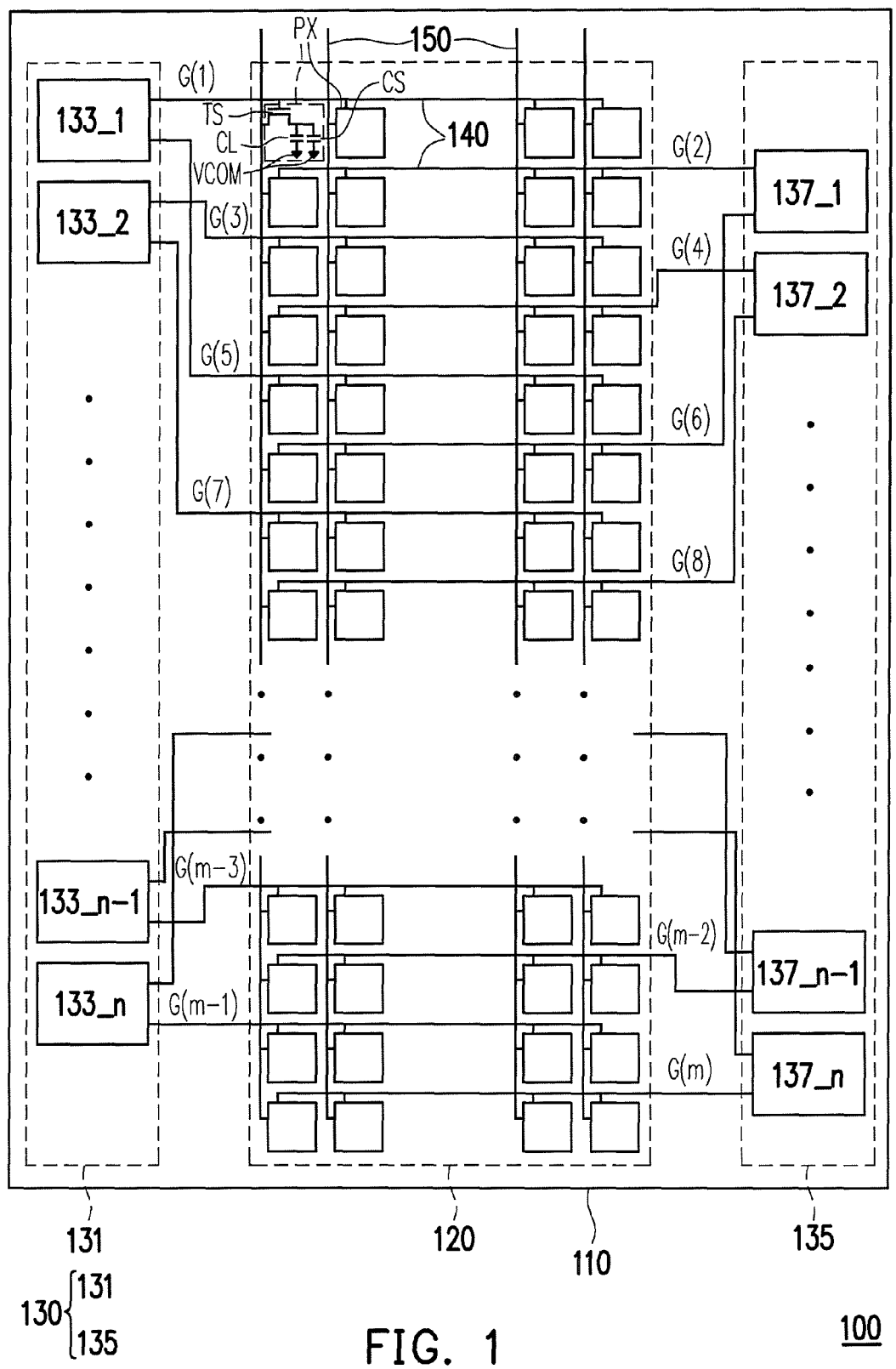
FIG. 1 is a system schematic diagram of a display panel according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a system schematic diagram of a display panel according to an embodiment of the invention. Referring to FIG. 1, in the present embodiment, the display panel 100 includes a substrate 110, a pixel array 120, a gate driving circuit 130, a plurality of gate lines 140 and a plurality of source lines 150, where the pixel array 120, the gate driving circuit 130, the gate lines 140 and the source lines 150 are all disposed on a same surface of the substrate 110. The pixel array 120 has a plurality of pixels PX, where each of the pixels PX is coupled to the corresponding gate line 140 and the corresponding source line 150 and has a switch transistor TS, a liquid crystal capacitor CL and a storage capacitor CS. A drain of the switch transistor TS is coupled to the corresponding source line 150, a gate of the switch transistor TS is coupled to the corresponding gate line 140, and the liquid crystal capacitor CL and the storage capacitor CS are connected in parallel between a source of the switch transistor TS and a common voltage Vcom.

The gate driving circuit 130 has a first sub-gate driving circuit 131 and a second sub-gate driving circuit 135, where the first sub-gate driving circuit 131 has a plurality of first shift registers (for example, 133_1-133_n) and is disposed at a left side (corresponding to a first side) of the pixel array 120, and the second sub-gate driving circuit 135 has a plurality of second shift registers (for example, 137_1-137_n) and is disposed at a right side (corresponding to a second side) of the pixel array 120 relative to the first sub-gate driving circuit 131, where n is a positive integer and is equal to a half of a total number of the gate lines 140, i.e. n=m/2.

In the present embodiment, the first shift registers (for example, 133_1-133_n) are coupled to the pixel array 120 through the gate line 140 for providing gate driving signals corresponding to odd row pixels to the pixel array 120 (for example G(1), G(3), . . . , G(m−1)), and the second shift registers (for example, 137_1-137_n) are coupled to the pixel array 120 through the gate line 140 for providing gate driving signals corresponding to even row pixels to the pixel array 120 (for example G(2), G(43), . . . , G(m)). Further, activation sequences of the odd first shift registers (for example, 133_1, 133_3, . . . , 133_n−1) and the even first shift registers (for example, 133_2, 133_4, . . . , 133_n) are separated, i.e. the first shift registers 133_1 and 133_2 are simultaneously activated to sequentially and alternately provide the odd gate driving signals G(1), G(3), G(5), G(7), and the others are deduced by analogy. Similarly, activation sequences of the odd second shift registers (for example, 137_1, 137_3, . . . , 137_n−1) and the even second shift registers (for example, 137_2, 137_4, . . . , 137_n) are separated, i.e. the second shift registers 137_1 and 137_2 are simultaneously activated to sequentially and alternately provide the even gate driving signals G(2), G(4), G(6), G(8), and the others are deduced by analogy. In other words, the gate driving circuit 130 is separated into four independent parts for sequential activation, i.e. activations of the odd first shift registers (for example, 133_1, 133_3, . . . , 133_n−1), the even first shift registers (for example, 133_2, 133_4, . . . , 133_n), the odd second shift registers (for example, 137_1, 137_3, . . . , 137_n−1) and the even second shift registers (for example, 137_2, 137_4, . . . , 137_n) are separated.

In some embodiments, one of the four parts of the gate driving circuit 130, i.e. one of the odd first shift registers (for example, 133_1, 133_3, . . . , 133_n−1), the even first shift registers (for example, 133_2, 133_4, . . . , 133_n), the odd second shift registers (for example, 137_1, 137_3, . . . , 137_n−1) and the even second shift registers (for example, 137_2, 137_4, . . . , 137_n) is used, or one of the first sub-gate driving circuit 131 and the second sub-gate driving circuit 135 is used, which is determined by those skilled in the art and is not limited by the invention.

Figure 2:
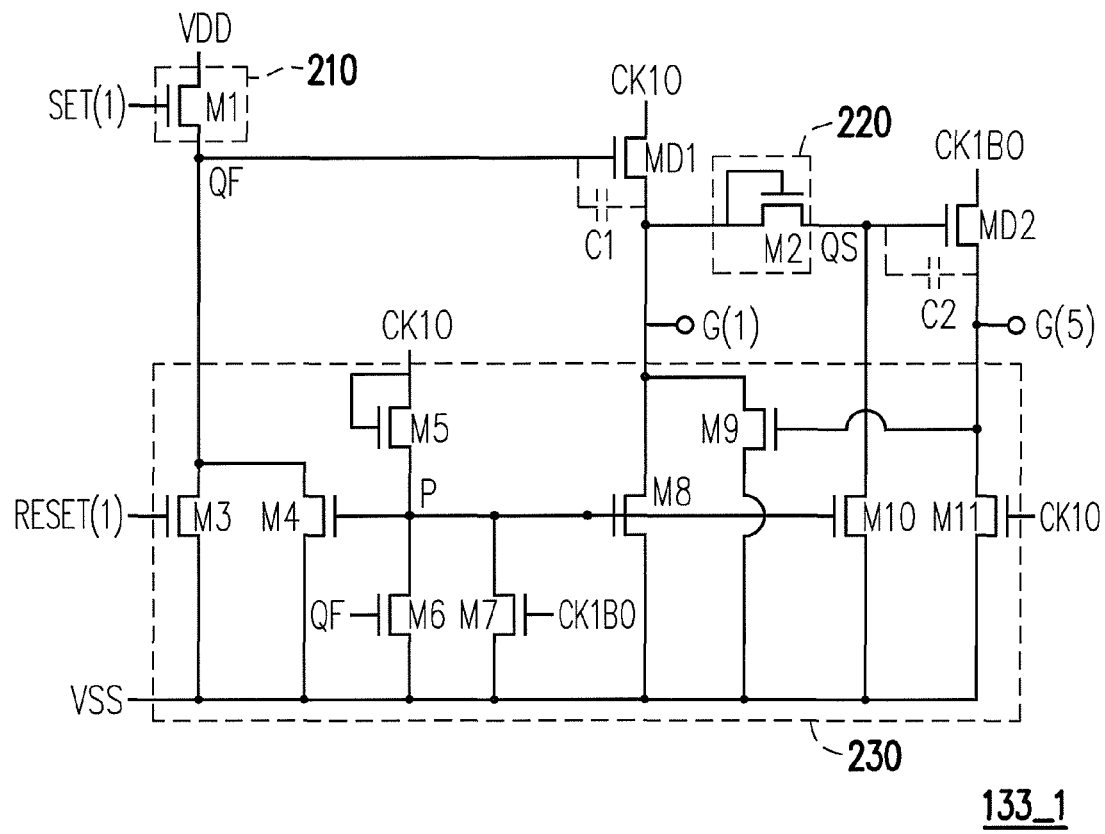
FIG. 2 is a circuit schematic diagram of a shift register according to an embodiment of the invention.

FIG. 2 is a circuit schematic diagram of a shift register according to an embodiment of the invention. Referring to FIG. 1 and FIG. 2, in the present embodiment, circuit structures and operation methods of the first shift registers (for example, 133_1-133_n) and the second shift registers (for example, 137_1-137_n) are substantially the same, and a main difference therebetween lies in the activation sequence, i.e. the first shift registers (for example, 133_1-133_n) and the second shift registers (for example, 137_1-137_n) probably receive different clock signals, and in the following description, the first shift register 133_1 is taken as an example for description.

The first shift register 133_1 includes a voltage providing unit 210, a first driving transistor MD1, a first capacitor C1, a voltage transmitting unit 220, a second driving transistor MD2, a second capacitor C2 and a voltage pull-down unit 230, wherein the first capacitor C1 and the second capacitor C2 are respectively parasitic capacitors of the first driving transistor MD1 and the second driving transistor MD2. The voltage providing unit 210 receives a setting signal SET(1) and a system high voltage VDD for providing a first terminal voltage QF. In other words, when the setting signal SET(1) is enabled, the voltage providing unit 210 outputs the system high voltage VDD to provide the first terminal voltage QF with a high voltage level (the system high voltage VDD); and when the setting signal SET(1) is disabled, the voltage providing unit 210 stops outputting the system high voltage VDD, and now the first terminal voltage QF is not influenced by the system high voltage VDD.

A drain (corresponding to a first terminal) of the first driving transistor MD1 receives a clock signal CK1O (corresponding to a first clock signal), a source (corresponding to a second terminal) of the first driving transistor MD1 provides a gate driving signal G(1) (corresponding to a first gate driving signal), and a gate (corresponding to a control terminal) of the first driving transistor MD1 receives the first terminal voltage QF. The first capacitor C1 is coupled between the gate and the source of the first driving transistor MD1. The voltage transmitting unit 220 receives the gate driving signal G(1) to provide a second terminal voltage QS. In other words, when a voltage level of the gate driving signal G(1) is higher than the second terminal voltage QS, the voltage transmitting unit 220 is turned on; and when the voltage level of the gate driving signal G(1) is lower than or equal to the second terminal voltage QS, the voltage transmitting unit 220 is turned off.

A drain (corresponding to a first terminal) of the second driving transistor MD2 receives a clock signal CK1BO (corresponding to a second clock signal), a source (corresponding to a second terminal) of the second driving transistor MD2 provides a gate driving signal G(5) (corresponding to a second gate driving signal), and a gate (corresponding to a control terminal) of the second driving transistor MD2 receives the second terminal voltage QS. The second capacitor C2 is coupled between the gate and the source of the second driving transistor MD2. The voltage pull-down unit 230 receives the first terminal voltage QF, the gate driving signals G(1) and G(5), the second terminal voltage QS, the clock signal CK1O, the second clock signal CK1BO, a reset signal RESET (1) and a system low voltage VSS, and pulls down the first terminal voltage QF, the gate driving signals G(1) and G(5) and the second terminal voltage QS.

Further, the voltage providing unit 210 includes a transistor M1 (corresponding to a first transistor). A drain (corresponding to a first terminal) of the transistor M1 receives the system high voltage VDD, a source (corresponding to a second terminal) of the transistor M1 provides the first terminal voltage QF, and a gate (corresponding to a control terminal) of the transistor M1 receives the setting signal SET(1). The voltage transmitting unit 220 includes a transistor M2 (corresponding to a second transistor). A drain (corresponding to a first terminal) of the transistor M2 receives the gate driving signal G(1), a source (corresponding to a second terminal) of the transistor M2 provides the second terminal voltage QS, and a gate (corresponding to a control terminal) of the transistor M2 receives the gate driving signal G(1).

The voltage pull-down unit 230 includes transistors M3-M11 (corresponding to a third transistor to an eleventh transistor). A drain (corresponding to a first terminal) of the transistor M3 receives the first terminal voltage QF, a source (corresponding to a second terminal) of the transistor M3 receives the system low voltage VSS, and a gate (corresponding to a control terminal) of the transistor M3 receives the reset signal RESET(1). A drain (corresponding to a first terminal) of the transistor M4 receives the first terminal voltage QF, a source (corresponding to a second terminal) of the transistor M4 receives the system low voltage VSS, and a gate (corresponding to a control terminal) of the transistor M4 receives a pull-down reference voltage P. A drain (corresponding to a first terminal) of the transistor M5 receives the clock signal CK1O, a source (corresponding to a second terminal) of the transistor M5 provides the pull-down reference voltage P, and a gate (corresponding to a control terminal) of the transistor M5 receives the clock signal CK1O.

A drain (corresponding to a first terminal) of the transistor M6 receives the pull-down reference voltage P, a source (corresponding to a second terminal) of the transistor M6 receives the system low voltage VSS, and a gate (corresponding to a control terminal) of the transistor M6 receives the first terminal voltage QF. A drain (corresponding to a first terminal) of the transistor M7 receives the pull-down reference voltage P, a source (corresponding to a second terminal) of the transistor M7 receives the system low voltage VSS, and a gate (corresponding to a control terminal) of the transistor M7 receives the second clock signal CK1BO. A drain (corresponding to a first terminal) of the transistor M8 receives the gate driving signal G(1), a source (corresponding to a second terminal) of the transistor M8 receives the system low voltage VSS, and a gate (corresponding to a control terminal) of the transistor M8 receives the pull-down reference voltage P.

A drain (corresponding to a first terminal) of the transistor M9 receives the gate driving signal G(1), a source (corresponding to a second terminal) of the transistor M9 receives the system low voltage VSS, and a gate (corresponding to a control terminal) of the transistor M9 receives the gate driving signal G(5). A drain (corresponding to a first terminal) of the transistor M10 receives the second terminal voltage QS, a source (corresponding to a second terminal) of the transistor M10 receives the system low voltage VSS, and a gate (corresponding to a control terminal) of the transistor M10 receives the pull-down reference voltage P. A drain (corresponding to a first terminal) of the transistor M11 receives the gate driving signal G(5), a source (corresponding to a second terminal) of the transistor M11 receives the system low voltage VSS, and a gate (corresponding to a control terminal) of the transistor M11 receives the clock signal CK1O.

According to the above description, the transistor M1 can be regarded as a transistor for pulling up the first terminal voltage QF. The first driving transistor MD1 can be regarded as a transistor in charge of pulling up and pulling down the gate driving signal G(1). The transistor M2 can be regarded as a transistor for pulling up the second terminal voltage QS and isolating the first driving transistor MD1 and the second driving transistor MD2. The second driving transistor MD2 can be regarded as a transistor for pulling up the gate driving signal G(5). The transistor M3 can be regarded as a transistor for pulling down the first terminal voltage QF. The transistor M9 can be regarded as a transistor for pulling down the gate driving voltage G(1), such that upper and lower edges of waveforms of the gate driving signals G(1) and G(5) are more aligned. The transistor M11 can be regarded as a transistor for pulling down the gate driving signal G(5). The transistors M4-M9, M10 can be regarded as noise free circuit blocks.

Figure 3:
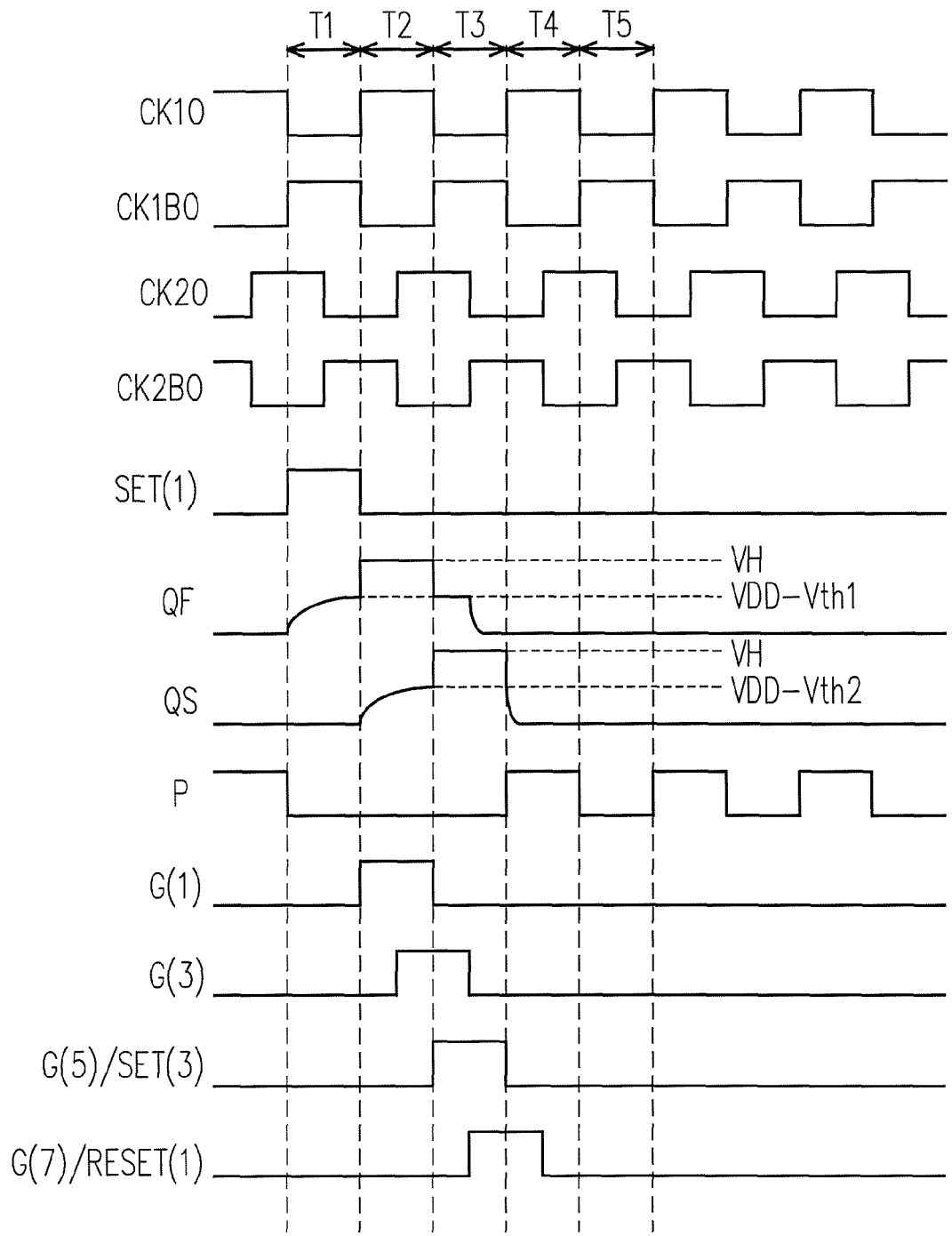
FIG. 3 is a waveform schematic diagram of a shift register according to an embodiment of the invention.

FIG. 3 is a waveform schematic diagram of the shift register according to an embodiment of the invention. Referring to FIG. 2 and FIG. 3, in the present embodiment, it is assumed that the odd first shift registers (for example, 133_1, 133_3, . . . , 133_n–1) receive the clock signals CK1O and CK1BO, and the even first shift registers (for example, 133_2, 133_4, . . . , 133_n) receive clock signals CK2O and CK2BO. Moreover, enabling periods of the odd gate driving signals (for example, G(1), G(3), G(5), G(7)) are partially overlapped to each other, i.e. the enabling periods of two adjacent odd gate driving signals (for example, G(1), G(3), G(5), G(7)) are overlapped by a half.

During a period T1, the setting signal SET(1) is enabled (which has a high voltage level) to turn on the transistor M1, and the first terminal voltage QF is gradually increased. Now, the gate driving signals G(1) and G(5) still have a low voltage level (for example, the system low voltage VSS), and limited by the increased first terminal voltage QF, the second clock signal CK1BO with the high voltage level, the clock signal CK1O with the low voltage level, the gate driving signal G(5) and the reset signal RESET(1), the voltage pull-down unit 230 does not operate, i.e. the pull-down reference voltage P does not turn on the transistors M4, M8 and M10.

During a period T2, the setting signal SET(1) is disabled (which has a low voltage level) to turn off the transistor M1, i.e. the first terminal voltage QF presents a floating state. Moreover, the first terminal voltage QF is raised to the system high voltage VDD minus a threshold voltage Vth1 of the transistor M1 (which is greater than a threshold voltage Vth2 of the first driving transistor MD1), so that the first driving transistor MD1 is turned on to output the high voltage level of the clock signal CK1O to serve as the enabled gate driving signal G(1). Now, the first capacitor C1 formed by the parasitic capacitor of the first driving transistor MD1 raises the first terminal voltage QF to a voltage VH higher than the system high voltage VDD to accelerate a charging speed (i.e. a rising speed) of the gate driving signal G(1), and the high voltage level of the gate driving signal G(1) may raise the second terminal voltage QS through the turned on transistor M2. Now, the second clock signal CK1BO has the low voltage level, so that the gate driving signal G(5) is stilled maintained to the low voltage level, and the transistors M5 and M6 are simultaneously turned on. In order to avoid enabling the pull-down reference voltage P during such period, an width-to-length ratio of a channel layer of the transistor M5 can be designed to be smaller than an width-to-length ratio of a channel layer of the transistor M6. Moreover, the transistor M11 is turned on under control of the enabled clock signal CK1O to transmit the system low voltage VSS to the gate driving signal G(1), so as to pull down the gate driving signal G(1).

During a period T3, the second terminal voltage QS is raised to the system high voltage VDD minus a threshold voltage Vth2 of the first driving transistor MD1 (which is greater than a threshold voltage of the second driving transistor MD2), so that the second driving transistor MD2 is turned on to output the high voltage level of the clock signal CK1BO to serve as the enabled gate driving signal G(5), where the enabled gate driving signal G(5) can be used to activate the first shift register 133_3, i.e. the enabled gate driving signal G(5) can be a setting signal SET(3) received by the first shift register 133_3. Now, the transistor M9 is turned on under control of the enabled gate driving signal G(5) to transmit the system low voltage VSS to the gate driving signal G(1). Moreover, it is assumed that the reset signal RESET(1) received by the first shift register 133_1 is the gate driving signal G(7), i.e. the enabling period of the reset signal RESET(1) and the enabling period of the gate driving signal G(5) are overlapped by a half. Before the transistor M5 is turned on under control of the reset signal RESET(1), the first terminal voltage QF still presents the floating state, i.e. the first terminal voltage QF is maintained to the high voltage level (which is VDD–Vth1), and the clock signal CK1O with the low voltage level pulls down the gate driving signal G(1); and after the transistor M5 is turned on under control of the reset signal RESET(1), the system low voltage VSS is transmitted to the first terminal voltage QF to pull down the first terminal voltage QF, so as to turn off the first driving transistor MD1.

During a period T4, the enabled clock signal CK1O turns on the transistor M5 to raise the pull-down reference voltage P, the transistor M6 is turned off under control of the first terminal voltage QF with the low voltage level, and the transistor M7 is turned off under control of the disabled clock signal CK1BO. After the pull-down reference voltage P is enabled, the transistors M4, M8 and M10 are turned on to pull down the first terminal voltage QF, the gate driving signal G(1) and the second terminal voltage QS. Moreover, the transistor M11 is turned on under control of the enabled clock signal CK1O to pull down the gate driving signal G(5). In this way, rising of the voltage levels of the first terminal voltage QF, the gate driving signals G(1) and G(5) and the second terminal voltage QS due to the noise is avoided, so as to avoid miss operation of the first shift register 133_3.

During a period T5, the enabled clock signal CK1BO turns on the transistor M7 to disable the pull-down reference voltage P, the transistor M6 is turned off under control of the first terminal voltage QF with the low voltage level, and the transistor M5 is turned off under control of the disabled clock signal CK1O. Moreover, the transistor M11 is turned off under control of the disabled clock signal CK1O. In this way, the transistors M4, M8, M10 and M11 are avoided to be in a long time of operation, so as to avoid reliability reduction thereof.

According to the above description, the first shift register 133_3 sequentially provides the enabled gate driving signals G(1) and G(5), and the enabling period of the gate driving signal G(5) is later than the enabling period of the gate driving signal G(1). Moreover, the clock signals CK1O and CK1BO are inverted signals, such that a rising edge of the enabling period of the gate driving signal G(5) is aligned to a falling edge of the enabling period of the gate driving signal G(1).

In the present embodiment, the gate driving signal G(1) is mainly controlled by the first driving transistor MD1, and is less relevant to the transistor M8, so that an width-to-length ratio of a channel layer of the first driving transistor MD1 can be designed to be greater than an width-to-length ratio of a channel layer of the transistor M8. Moreover, the setting signal (for example, SET(1)) is used for enabling the first terminal voltage (for example, QF), so that the enabling period of the setting signal (for example, SET(1)) is earlier than the enabling period of the corresponding gate driving signal (for example, G(1)), i.e. the setting signal (for example, SET(1)) can be a gate start signal or a gate driving signal output by the odd first shift register (for example, 133_1, 133_3, . . . , 133_n−1) of a previous stage. The reset signal (for example, RESET(1)) is used for disabling the first terminal voltage (for example, QF), so that the enabling period of the reset signal (for example, RESET(1)) is later than the enabling period of the corresponding gate driving signal (for example, G(1)), i.e. the reset signal (for example, RESET(1)) can be a gate driving signal output by the odd first shift register (for example, 133_1, 133_3, . . . , 133_n−1) of a next stage or the even first shift register (for example, 133_2, 133_4, . . . , 133_n) of a next stage.

In summary, in the display panel of the invention, each of the shift registers in the gate driving circuit sequentially provides two gate driving signals, and the first driving transistor and the second driving transistor are sequentially turned on, so as to avoid the influence caused by excessively large difference of driving capabilities of the first driving transistor and the second driving transistor. Moreover, the shift registers in the gate driving circuit can be separated into a plurality of parts for sequential activation, so as to decrease the number of transmitted levels of the clock signal to reduce possibility of operation abnormity caused by excessive attenuation of the clock signal.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A display panel, comprising:
   a substrate;
   a pixel array, disposed on the substrate; and
   a gate driving circuit, disposed on the substrate, and coupled to the pixel array for providing a plurality of gate driving signals to the pixel array, wherein the gate driving circuit has a plurality of shift registers, and each of the shift registers comprises:
   a voltage providing circuit, receiving a setting signal and a system high voltage to provide a first terminal voltage;
   a first driving transistor, having a first terminal receiving a first clock signal, a second terminal providing a first gate driving signal in the gate driving signals, and a control terminal receiving the first terminal voltage;
   a first capacitor, coupled between the control terminal and the second terminal of the first driving transistor;
   a voltage transmitting circuit, receiving the first gate driving signal to provide a second terminal voltage;
   a second driving transistor, having a first terminal receiving a second clock signal, a second terminal providing a second gate driving signal in the gate driving signals, and a control terminal receiving the second terminal voltage;
   a second capacitor, coupled between the control terminal and the second terminal of the second driving transistor; and
   a voltage pull-down circuit, receiving the first terminal voltage, the first gate driving signal, the second terminal voltage, the second gate driving voltage, the first clock signal, the second clock signal, a reset signal and a system low voltage, and pulling down the first terminal voltage, the first gate driving signal, the second terminal voltage and the second gate driving voltage.

2. The display panel as claimed in claim 1, wherein the voltage providing circuit comprises:
   a first transistor, having a first terminal receiving the system high voltage, a second terminal providing the first terminal voltage, and a control terminal receiving the setting signal.

3. The display panel as claimed in claim 1, wherein the voltage transmitting circuit comprises:
   a second transistor, having a first terminal receiving the first gate driving signal, a second terminal providing the second terminal voltage, and a control terminal receiving the first gate driving signal.

4. The display panel as claimed in claim 1, wherein the voltage pull-down circuit comprises:

a third transistor, having a first terminal receiving the first terminal voltage, a second terminal receiving the system low voltage, and a control terminal receiving the reset signal;

a fourth transistor, having a first terminal receiving the first terminal voltage, a second terminal receiving the system low voltage, and a control terminal receiving a pull-down reference voltage;

a fifth transistor, having a first terminal receiving the first clock signal, a second terminal providing the pull-down reference voltage, and a control terminal receiving the first clock signal;

a sixth transistor, having a first terminal receiving the pull-down reference voltage, a second terminal receiving the system low voltage, and a control terminal receiving the first terminal voltage;

a seventh transistor, having a first terminal receiving the pull-down reference voltage, a second terminal receiving the system low voltage, and a control terminal receiving the second clock signal;

an eighth transistor, having a first terminal receiving the first gate driving signal, a second terminal receiving the system low voltage, and a control terminal receiving the pull-down reference voltage;

a ninth transistor, having a first terminal receiving the first gate driving signal, a second terminal receiving the system low voltage, and a control terminal receiving the second gate driving signal;

a tenth transistor, having a first terminal receiving the second terminal voltage, a second terminal receiving the system low voltage, and a control terminal receiving the pull-down reference voltage; and an eleventh transistor, having a first terminal receiving the second gate driving signal, a second terminal receiving the system low voltage, and a control terminal receiving the first clock signal.

5. The display panel as claimed in claim 4, wherein a width-to-length ratio of a channel layer of the fifth transistor is smaller than a width-to-length ratio of a channel layer of the sixth transistor, and a width-to-length ratio of a channel layer of the first driving transistor is greater than a width-to-length ratio of a channel layer of the eighth transistor.

6. The display panel as claimed in claim 1, wherein the first capacitor and the second capacitor are respectively parasitic capacitors of the first driving transistor and the second driving transistor.

7. The display panel as claimed in claim 1, wherein the first clock signal is an inverted signal of the second clock signal.

8. The display panel as claimed in claim 1, wherein an enabling period of the second gate driving signal is later than an enabling period of the first gate driving signal, and a rising edge of the enabling period of the second gate driving signal is aligned with a falling edge of the enabling period of the first gate driving signal.

9. The display panel as claimed in claim 8, wherein an enabling period of the setting signal is earlier than the enabling period of the first gate driving signal, and an enabling period of the reset signal is later than the enabling period of the first gate driving signal.

10. The display panel as claimed in claim 1, wherein the gate driving circuit has a first sub-gate driving circuit and a second sub-gate driving circuit, wherein the first sub-gate driving circuit has a plurality of first shift registers in the plurality of shift registers and is disposed at a first side of the pixel array, and the second sub-gate driving circuit has a plurality of second shift registers in the plurality of shift registers and is disposed at a second side of the pixel array opposite to the second side.

* * * * *